United States Patent [19]

Yamaki et al.

[11] Patent Number: 4,627,053
[45] Date of Patent: Dec. 2, 1986

[54] METHOD OF REPAIRING SEMICONDUCTOR MEMORY

[75] Inventors: Yooji Yamaki, Yokohama; Shigenori Sakai, Kamakura, both of Japan

[73] Assignee: Hitachi, Ltd., Tokyo, Japan

[21] Appl. No.: 595,411

[22] Filed: Mar. 30, 1984

[30] Foreign Application Priority Data

Mar. 31, 1983 [JP] Japan ............................ 58-53972

[51] Int. Cl.$^4$ .................... G01R 31/28; G11C 29/00
[52] U.S. Cl. .................................... 371/10; 371/21
[58] Field of Search .............. 371/10, 21; 364/200, 364/900; 324/73 R

[56] References Cited

U.S. PATENT DOCUMENTS

| | | | |
|---|---|---|---|
| 4,380,811 | 4/1983 | Gotze et al. | 371/10 |
| 4,435,754 | 3/1984 | Chow et al. | 364/200 |
| 4,460,997 | 7/1984 | Harns | 371/10 |
| 4,460,999 | 7/1984 | Schmidt | 371/21 |

OTHER PUBLICATIONS

Smith et al., Laser Programmable Redundancy and Yield Improvement in a 64K DRAM, IEEE Journal of Solid-State Circuits, vol. SC-16, No. 5, Oct. 1981, pp. 506-514.
Hayasaka et al., Testing System for Redundant Memory, 1982 IEEE Test Conference, pp. 240-244.

Primary Examiner—Charles E. Atkinson
Attorney, Agent, or Firm—Antonelli, Terry & Wands

[57] ABSTRACT

In a method of repairing a semiconductor memory device having spare lines, all possible solutions of remedy using spare lines or spare blocks are obtained based on the result of test for the device, and then the possible solutions are screened under conditions related to the quality and reliability of the device so as to determine the best solution.

7 Claims, 32 Drawing Figures

| NO. | ⓐ | | | ⓑ | | | ⓒ | | ⓓ | | | |
|---|---|---|---|---|---|---|---|---|---|---|---|---|
| 1 | 1 | 0 | 0 | 1 | | | 2 | | 0 | 1 | 1 | 0 |
| 2 | 2 | 1 | 1 | 0 | | | 2 | | 1 | 0 | 0 | 1 |
| 3 | 2 | 1 | 0 | 1 | | | 2 | | 0 | 1 | 1 | 0 |
| 4 | 2 | 0 | 1 | 1 | | | 1 | | 0 | 0 | 1 | 0 |

| | | | | |
|---|---|---|---|---|
| UNIT ROW BLOCK | | | | |
| UNIT ROW BLOCK | | | | |
| UNIT ROW BLOCK | | | | |
| UNIT ROW BLOCK | | | | |

71

UNIT COLUMN BLOCK (×4)

| NO | CONTENTS | CHECK |
|---|---|---|
| 1 | ABANDON REPAIR IF A SUBMATRIX WITH $n_1$ OR MORE DEFECTIVE BITS EXISTS. | YES |
| 2 | ABANDON REPAIR IF REMEDY DETERMINATE LINES EXCEED $n_2$ LINES. | YES |
| 3 | ABANDON REPAIR IF TOTAL DEFECTIVE BITS EXCEED $n_3$ BITS. | YES |
| 4 | SELECT A SOLUTION REQUIRING MINIMUM SPARE LINES USED. | YES |
| 5 | SELECT A SOLUTION REQUIRING MINIMUM SPARE WORD LINES. | NO |
| 6 | SELECT A SOLUTION REQUIRING MINIMUM SPARE DATA LINES. | YES |
| 7 | SELECT A SOLUTION WHICH MINIMIZES STRESS DUE TO FUSE CUT FOR PROGRAMMING. | YES |
| ⋮ | ⋮ | ⋮ |

METHOD OF REPAIRING SEMICONDUCTOR MEMORY

BACKGROUND OF THE INVENTION

The present invention relates to a system for repairing a semiconductor memory device having a spare memory section in a form such as spare lines or spare blocks, wherein a line including a defective bit or bits is replaced with, for example, a spare line so that the device is placed in acceptable form.

Generally, programmable read-only memory arrays (PROMs) and random access memory arrays (RAMs) have an addressable binary array formed in a matrix of rows and columns and a decoder associated with the array. As it is known in the art, such memory devices are provided therein with spare word lines and data lines arranged in rows and columns (these lines will be termed generically spare lines when referred to inclusively) so that a line including a defective bit or bits is replaced with a spare line, and this arrangement is significantly contributes to the enhancement of the yield in manufacturing semiconductor memory devices.

One technical problem with such memory devices with spare lines is to determine which ones of the spare lines on rows and/or columns should be used for relieving a plurality of defective bits existing at random in the array.

Prior art processes for relieving defective bits through the selective use of spare lines are described in an article entitled, "Laser Programmable Redundancy and Yield improvement in 64K DRAM", by Robert T. Smith et al., IEEE Journal of Solid-state Circuits, Vol. SC-16, No. 5, October 1981, and an article entitled, "Testing System for Redundant Memory", by Y. Hayasaka et al., IEEE Test Conference 1982.

In introducing spare lines or blocks in a semiconductor memory device, the consideration on the device structure and physical structure of the memory device becomes important, and this is also true in the analysis for repairing a semiconductor memory device. Namely, it is desirable from the viewpoint of device structure and physical structure of the memory device to choose the best solution out of a plurality of possible solutions for repair.

A recent trend of semiconductor memory devices is the provision of spare blocks which allow simultaneous replacement of a number of lines in an area in which defective bits exist. Spare blocks are provided with an associated programmable decoder on which the address of block including defective bits is programmed. Spare blocks may include row-directional blocks and column-directional blocks, and it is necessary to determine which spare block should be used first on the basis of the quality and performance considerations for the device when the marginal operating conditions differ due to the disposition of spare blocks in the device.

The decoder is programmed either through the electrical process as disclosed in, for example, Japanese Patent Laid-open No. 53-10228 (U.S. patent application Ser. No. 705,997), or by using the laser beam. These programming methods, however, render stress to the semiconductor memory device, resulting possibly in the deterioration of reliability. Provided that the programmable decoder is written in only for logical 1's bits and the number of 1's bits depends on the address of a block including defective bits, the solution for repair with the least number of 1's bits is desirable. The determination of a solution for repair in consideration of retaining the device quality, performance and reliability is not taken into account in the above-mentioned two methods.

SUMMARY OF THE INVENTION

It is an object of the present invention to provide a method of repairing a semiconductor memory device having spare lines, wherein determination is made on the solution for repair at minimal deterioration of the device reliability and performance in consideration of the circuit and layout design and fabricating process.

The present invention features that all possible solutions for repair using spare lines or blocks are first extracted from the result of device test, and then the possible solutions are screened under certain conditions so as to choose the best solution for repair.

DESCRIPTION OF THE PREFERRED EMBODIMENTS

The memory test system related to the present invention will first be described in brief with reference to FIG. 1. In the following description, the term "line" includes the meaning of block unless otherwise stated.

Figure 1:
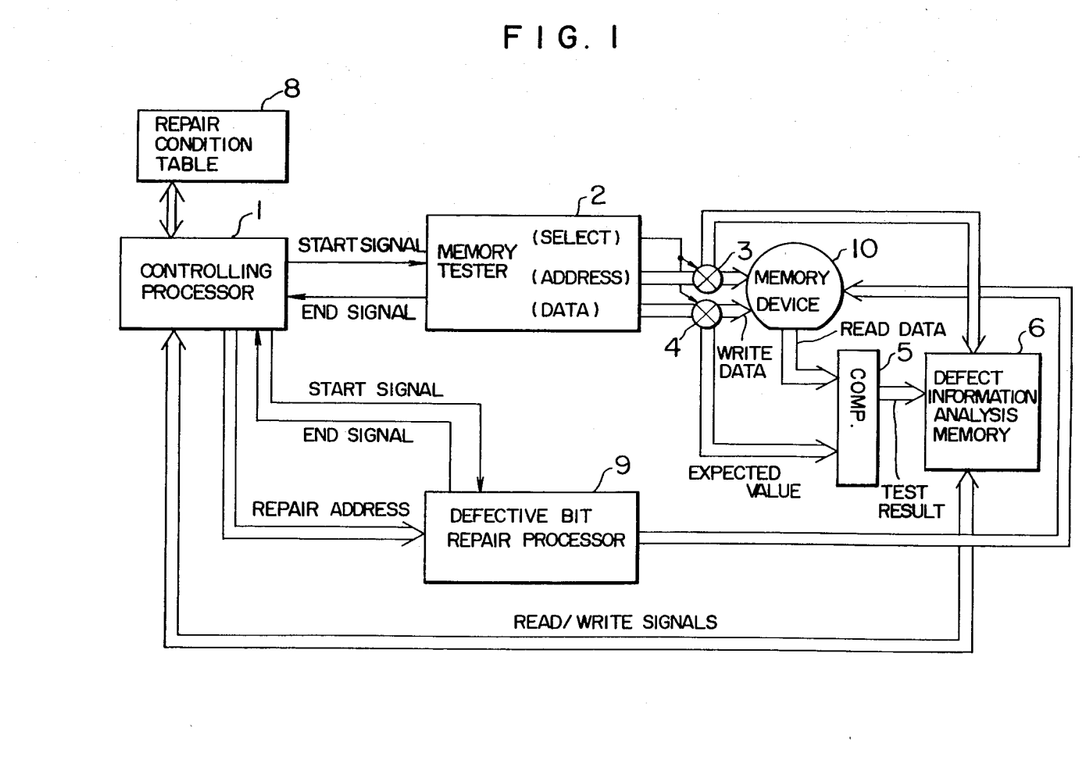
FIG. 1 is a block diagram showing the memory test system to which is applied the first embodiment of the present invention.

The memory test system shown in FIG. 1 includes a controlling processor 1, memory tester 2, gate circuits 3 and 4, comparator 5, defect information analysis memory 6, repair condition table 8, defective bit repair processor 9, and semiconductor memory device under test 10.

The controlling processor 1 sends the start signal to the memory tester 2, which then writes data into the semiconductor memory device 10. The gate circuits 3 and 4 are set to establish the write mode by the mode setting signal so that nothing is stored in the defect information analysis memory 6.

Subsequently, the memory tester 2 verifies the contents of the memory device 10. For this, the tester 2 establishes the read mode for the gate circuits 3 and 4, commonly addresses the memory device and defect information analysis memory 6, and provides the expected values of readout data. The comparator 5 compares data read out from the memory device 10 with the expected values and stores the test result in the defect information analysis memory 6, "0" for normal bit positions and "1" for defective bit positions. Upon completion of this process, the memory tester 2 sends the end signal back to the controlling processor 1.

Figure 2A:
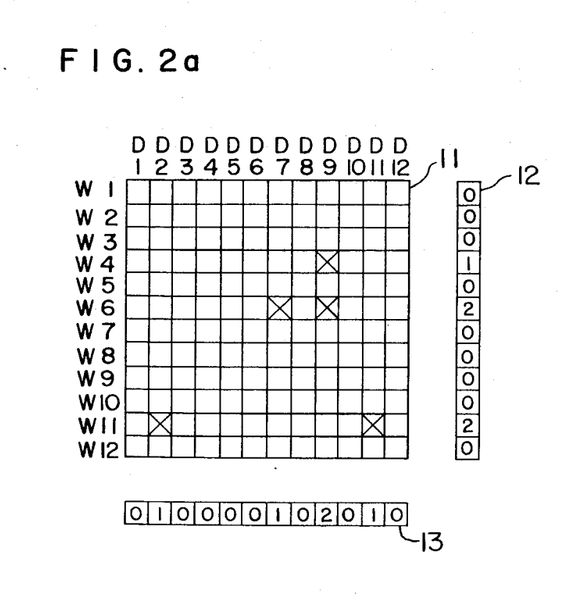
FIG. 2a is a diagram showing the memory bit matrix with the description of the test result.

The following describes the method of repairing a semiconductor memory device 10 with a memory bit matrix of, as an example, 12-by-12, on the assumption that the data collation result obtained in the defect information analysis memory 6 is as shown in FIG. 2a, where defective bits are marked by the symbol "x".

Figure 2B:
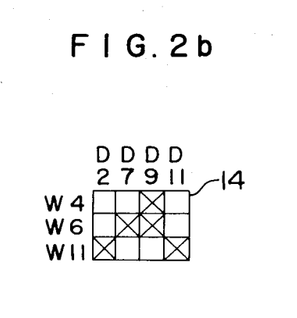
FIG. 2b is a diagram showing the defective bit matrix.

The controlling processor 1 in FIG. 1 performs the following processes. First, defective bits in the memory bit matrix 11 are counted for each row and column separately to obtain the results in the row defect counter 12 and column defect counter 13 as shown in FIG. 2a. Intersections of lines which have non-zero values in the row defect counter 12 and column defect counter 13 are extracted as elements to form a defective bit matrix 14 shown in FIG. 2b.

Assuming that the memory bit matrix 11 of FIG. 2a is provided with spare lines of 2 rows by 2 columns, the problem of replacing the defective bits in the memory bit matrix 11 is reduced to the problem of assigning the 2-by-2 spare lines to the defective bits in the defective bit matrix 14. The following describes the determination on the presence or absence of possible assignments (i.e., solutions for repair) and the counting of the possible solutions. Assignment methods fall into the assignment based on the row and the assignment based on the column.

Figure 3A:
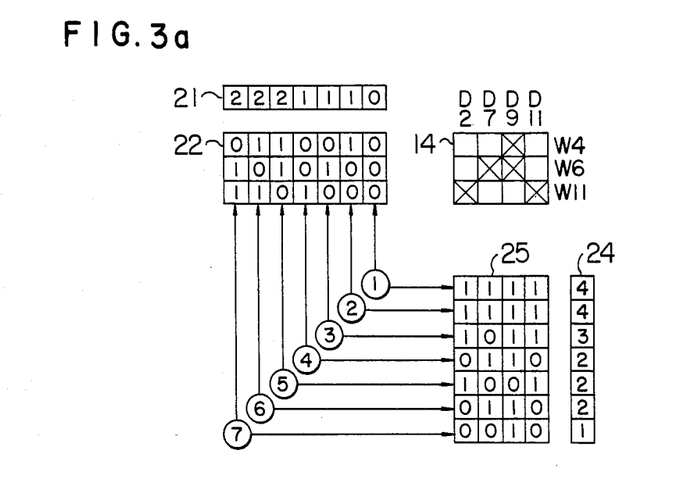
FIG. 3a is an illustration showing the count of solutions based on the assignment from the row.

The assignment based on the row will first be explained using FIGS. 3a–3f. For the 3-row, 4-column defective bit matrix 14, a maximum of two spare lines can be assigned to the row. In FIG. 3a, reference number 22 denotes a spare row mask vector, 25 is a spare column assignment vector, and 21 and 24 are strings containing the number of spare rows used and the number of spare columns used, respectively.

In the first case where no spare row is used, there is only one way as shown by ① in the spare row mask vector 22. In this case, four spare columns are needed as shown in the spare column assignment vector 25 and the spare column requirement string 24, and it is understood that the relief of all defective bits is not possible.

In the second case where only one spare row is used, there are three ways as shown by ②, ③ and ④ in FIG. 3a. In this case, among items ②, ③ and ④ in the spare column assignment vector 25, item ④ meets the condition of two spare columns or less.

Finally, in case two spare rows are used, there are three ways as shown by ⑤, ⑥ and ⑦ in the spare row mask vector 22. In this case, all items meet the condition of two spare columns or less.

In this way, for the assignments of all combination of the given number of spare rows used to relieve defective bits, the number of spare columns needed to relieve the remaining defective bits is calculated, and when the calculated value is within the given number of spare columns, this assignment is determined to be a possible solution for repair. It will be appreciated that the assignment of spare rows in all possible combinations can readily be realized by the programming with reference to FIG. 3a.

Figure 3B:
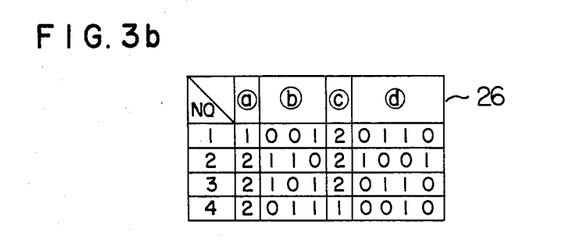
FIG. 3b is a table of solutions for repair.
Figure 3C:
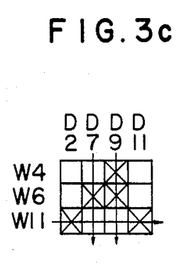
FIGS. 3c through 3f are illustrations of solutions.
Figure 3D:
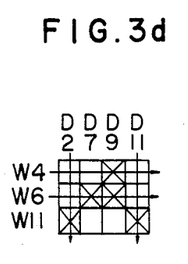
Figure 3E:
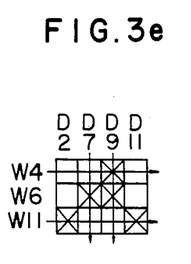
Figure 3F:
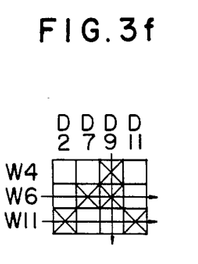

As a result, a solution table 26 made up of: ⓐ a string of spare row requirement, ⓑ spare row mask vector, ⓒ string of spare columns requirement, and ⓓ spare column assignment vector, for four possible solutions (Nos. 1, 2, 3 and 4) is obtained as shown in FIG. 3b. The use of spare lines in accordance with the above solutions Nos. 1–4 are shown in FIGS. 3c through 3f, respectively.

In the method of assignment based on the row, if no solution exists for a given number of spare rows of n, it is obvious that no solution is expected for n-1 spare rows. Accordingly, it is efficient practically to try assignment for the defective bit matrix 14 in the descending order from the largest number of spare rows, i.e., in the order of ⑤, ⑥, ⑦, ②, ③, ④, and ① in the case of FIG. 3a.

Figure 4A:
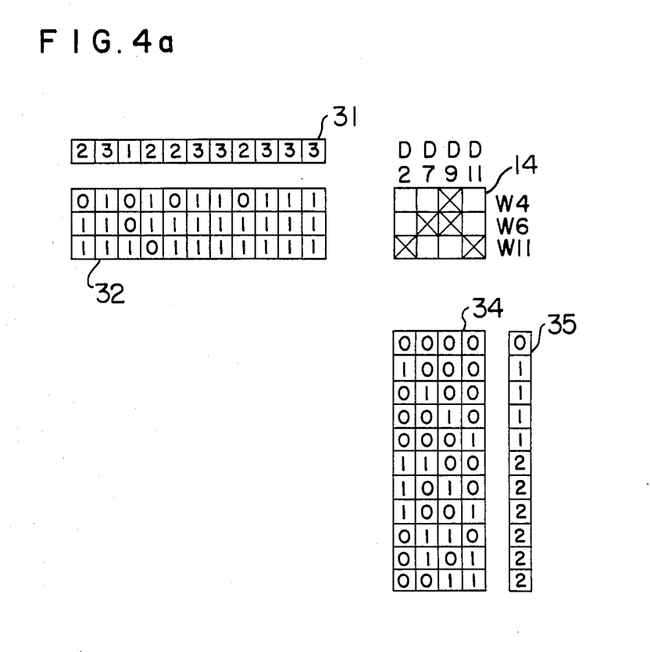
FIG. 4a is an illustration showing the count of solutions based on the assignment from the column.

Next, the assignment based on the column for a 3-row, 4-column defective bit matrix 14 will be explained using FIGS. 4a and 4b. In FIG. 4a, reference number 34 denotes a spare column mask vector, 32 is a spare row assignment vector, and 35 and 31 are strings of spare column requirement and spare row requirement, respectively. A maximum of two spare columns can be assigned to the defective bit matrix 14. Spare column mask vector 34 (row vectors or 4 degrees in this case) are generated on the column side, and spare row assignment vectors 32 representing positions which need spare lines are obtained correspondingly on the row side. For each of the spare row assignment vectors 32 (column vectors of 3 degrees in this case), the number of "1"s is counted to obtain a string of spare row requirement 31. Then, possible solutions are determined by selecting items of the string 31 indicative of the number of spare rows within the given value 2.

Figure 4B:
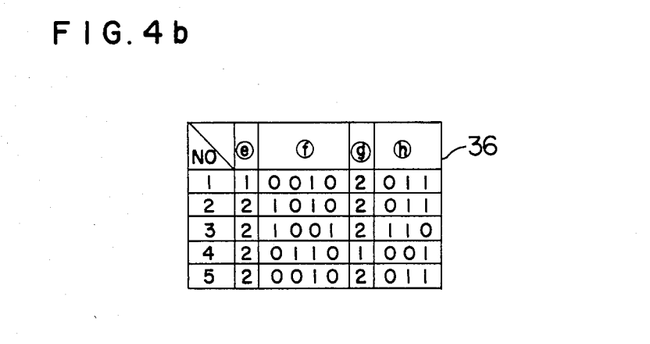
FIG. 4b is a table of solutions for repair.

As a result, a solution table 36 made up of: ⓔ string of spare column requirement, ⓕ spare column mask vector, ⓖ string of spare row requirement, and h spare row assignment vector is obtained as shown in FIG. 4b. In practice, it is efficient to try assignment in the descending order from the largest number of spare columns for the same reason as mentioned above.

Generally, in the assignment based on the row for a n-row, m-column defective bit matrix with $n_d$ spare lines, the number of possible assignments is given as follows:

$$\text{For } n_d \geq n, \sum_{i=0}^{n} nCi \quad \text{and}$$

-continued $$\text{For } n_d < n, \sum_{i=0}^{n_d} nCi$$

Similarly, in the assignment based on the column for a n-row, m-column defective bit matrix with $n_w$ spare lines, the number of possible assignments is given as follows:

$$\text{For } n_w \geq m, \sum_{i=0}^{m} mCi \text{ and}$$

$$\text{For } n_w < m, \sum_{i=0}^{n_w} mCi$$

The alue $$\sum_{i=0}^{n} nCi \text{ or } \sum_{i=0}^{n_d} nCi$$

represents the number of spare column mask vectors, and the value $$\sum_{i=0}^{m} mCi \text{ or } \sum_{i=0}^{n_w} mCi$$

represents the number of spare row mask vectors.

Next, the procedures for the process of FIGS. 3a—3f l will be explained using FIGS. 5a-5d FIG. 5a shows in a flowchart the process for the assignment based on the row. In the following description, the number of spare lines is assumed to be 2 rows by 2 columns as in the case of FIG. 3b.

First, in step 51, the spare row mask vectors 22 (①-⑦) shown in FIG. 3a are generated. In step 52, the process of generating spare column assignment vectors is executed. Namely, a row or rows of the defective bit matrix 14 corresponding to 1's position(s) of a spare row mask vector 22 generated in step 51 are masked off and then remaining elements of the matrix 14 are taken as a logical OR in the direction of the column, and this operation is repeated for all vectors 22 to obtain the spare column assignment vectors 25 (①-⑦) shown in FIG. 3a.

Subsequently, in step 53, the number of "1"s in the spare column assignment vectors 25 is counted to obtain the string of spare column requirement 24. Finally, in step 54, possible solutions are lined up. Namely, among items of the string 24 obtained in step 53, items of spare column requirement within two columns are picked up to list a spare row requirement string 21, spare row mask vectors 22, a spare column requirement string 24 and spare column assignment vectors 25 to complete the solution table 26 as shown in FIG. 3b.

Solutions by the assignment based on the column can also be obtained in the similar procedures, and these procedures can of course be realized also through various hardware arrangements.

Next, the selection of the best solution out of the lined up possible solutions in consideration of the device quality, performance and reliability will be described using, as an example, the previous solutions determined by the assignment based on the row as shown in FIGS. 3b and 3c-3f.

As the first example, selection of the best solution based on two conditions: (1) the minimum number of spare lines are used, and (2) spare columns are used reluctantly (The first condition takes precedence over the second.) will be explained.

Among four possible solutions obtained in the solution table 26 in FIG. 3b, solutions No. 1 (FIG. 3c) and No. 4 (FIG. 3f) requiring minimal three spare lines are selected to meet the first condition. Then, solution No. 4 requiring less spare column than No. 1 is finally selected to meet the second condition. The final solution can be obtained through relatively simple comparison operations as will be appreciated by making reference to the spare row requirement string (a) and spare column requirement string (c).

Figure 6A:
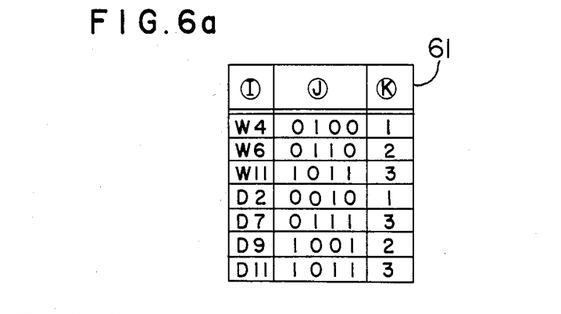
FIG. 6a is a table containing bit patterns of the matrix address of defective bits.

Next, as the second example, selection of the best solution based on the condition that the memory device is rendered minimum stress when the address decoder is programmed electrically or optically as mentioned previously will be explained. For carrying out the selected solution for the memory device, it is necessary to program the address of lines to be repaired (e.g., word lines W4 and W6, and data lines D2, D7, D9 and D11 in the cases of FIGS. 3c-3f). FIG. 6a shows the address bit pattern table of the defective bit matrix containing the symbolic address (I), address bit pattern (J) and the count of "1"s (K) included in the bit pattern. (Note that in the preceding invention of Japanese Patent Laid-open No. 53-10228 (U.S. patent application Ser. No. 705,997) mentioned previously, a number of fuses specified by (k) are cut for programming.)

Figure 6B:
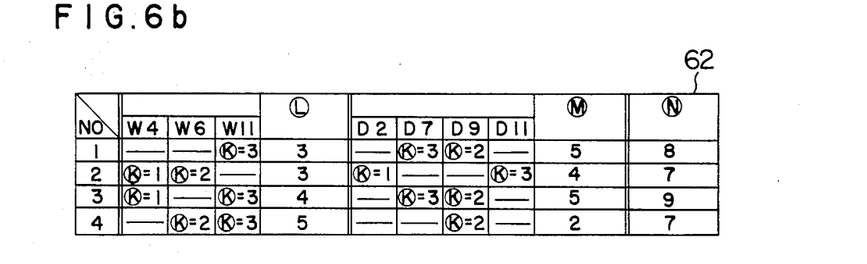
FIG. 6b is a table containing the number of programmed bits.

FIG. 6b shows the number of fuses to be cut for programming for the four solutions No. 1 through No. 4 shown in FIGS. 3b-3f. In this table, the total number of bits to be programmed (N) is obtained as the sum of the number of bits on the row (word lines) (L) and the number of bits on the column (data lines) (M), and solutions No. 2 and No. 4 requiring the minimum number of fuse cut (7) are found. Although two solutions are extracted in the second example, it will readily be appreciated that No. 4 is the best solution when an additional condition, e.g., such as that of the first example, is taken into account.

The procedures for processing the above two examples will be explained using the flowchart of FIG. 5b. In FIG. 5b, step A is the selecting process based on the minimum number of spare lines as has been explained as condition (1) of the first example, step B is the selecting process based on the reluctant use of spare columns due to a less marginal operating condition as has been explained as condition (2) of the first example, and step C is the selecting process based on the minimum stress in programming as has been explained in the second example. The number of repetitions of the process tested in step 56 is controlled by a register 58, as shown in FIG. 5c, provided in the controlling processor 1 of FIG. 1. The selection of a process in step 55 is carried out by the operation of the controlling processor 1 by making reference to the condition table 8 shown in FIG. 1 and FIG. 5c. As a consequence, execution of complex procedures is made possible by rewriting registration names A, B, C, etc. in the condition table 8 and changing the value of the register 58, and determination of a condition is made flexible.

Figure 5A:
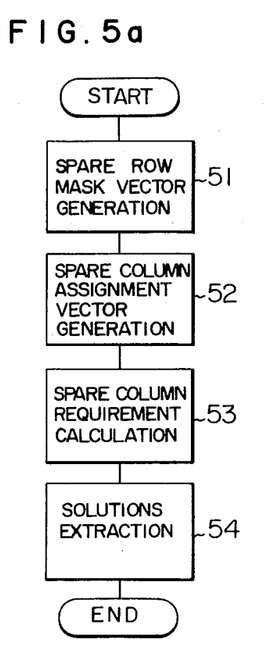
FIGS. 5a through 5d are flowcharts of programs executed by the processor.
Figure 5B:
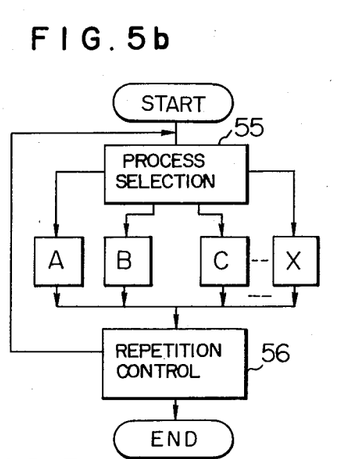
Figure 5C:
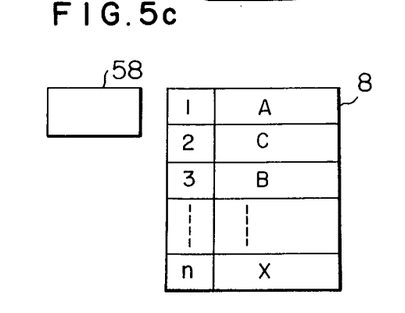
Figure 5D:
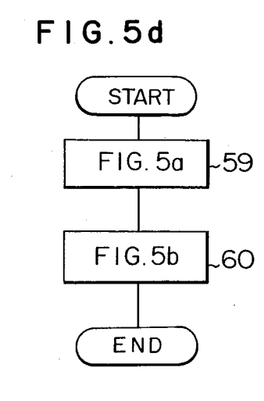

FIG. 5d shows a complete flowchart formed by cascading the flowchart shown in FIG. 5a (generally referred to as step 59) and the flowchart shown in FIG. 5b (generally referred to as step 60), and through the operation of this complete flowchart, possible solutions are lined up and then the best solution is determined.

The best solution for repair obtained by the foregoing processes is transferred from the controlling processor 1 to the defective bit remedy processor 9 in which fuses are cut for programming. That is, when the defective bit remedy processor 9 starts operating in response to the start signal issued by the controlling processor 1, the processor 9 carries out the programming of the decoder in the memory device 10, and after the process has been completed, it sends the end signal to the controlling processor 1.

Figure 7A:
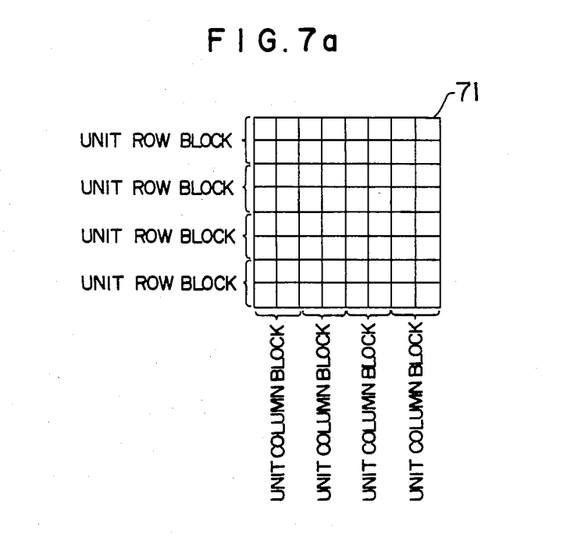
FIGS. 7a and 7b are diagrams showing examples repair of the memory bit matrix of block-units and the equivalent memory bit matrix.
Figure 7B:
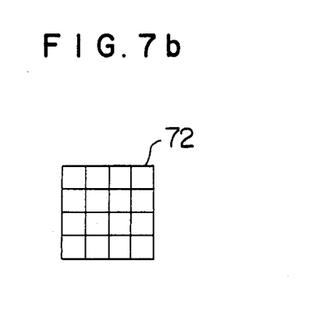
Figure 8:
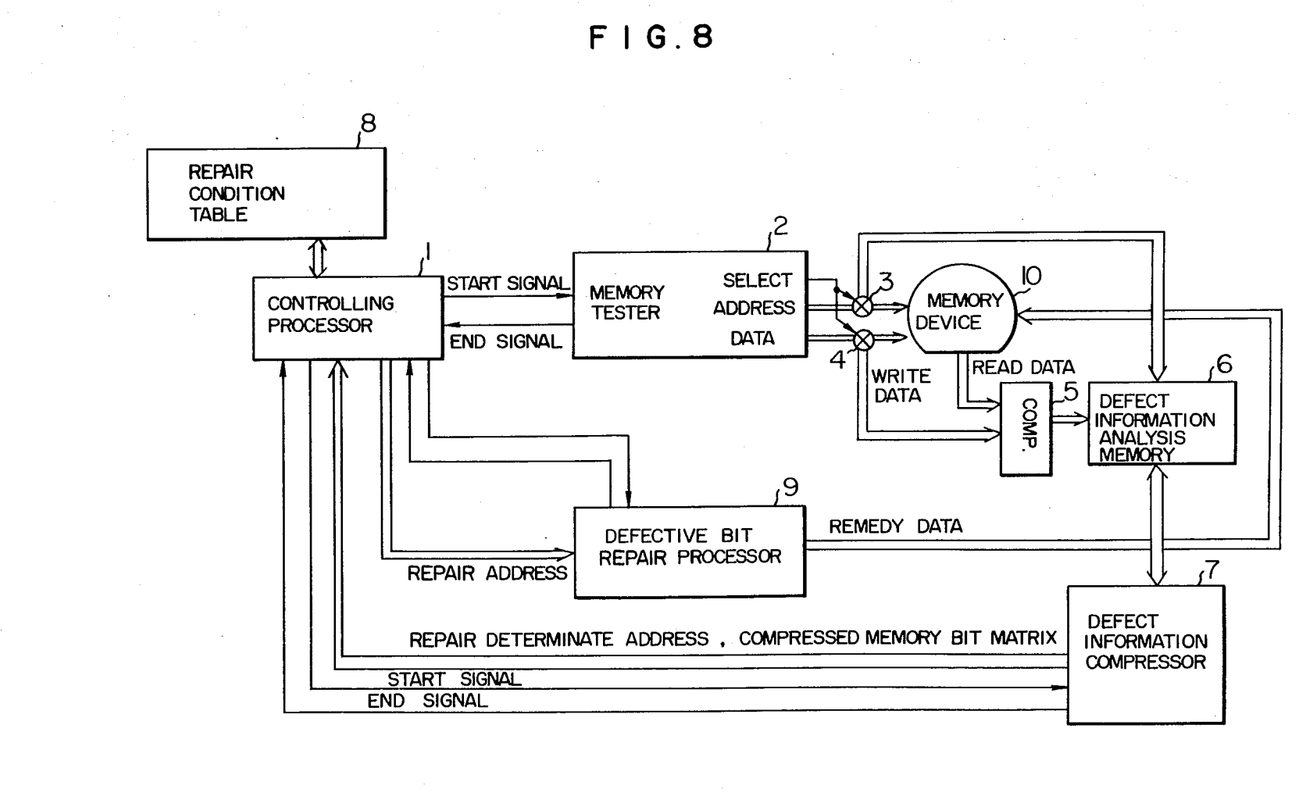
FIG. 8 is a block diagram showing the memory test system to which is applied the second embodiment of the present invention.

Although in the foregoing description defective bits of a semiconductor memory device are replaced with spare lines, the present invention can of course be applied to semiconductor memory devices in which defective bits are replaced in block units. For example, a memory bit matrix 71 as shown in FIG. 7a has four unit row blocks each consisting of two arbitrary row lines and four unit column blocks each consisting of two arbitrary column lines. When the device is provided with two spare row blocks and two spare column blocks, two unit row blocks and two unit column blocks of the memory bit matrix 71 can be replaced with the spare row blocks and the spare column blocks, respectively. In this case, if each of the unit column blocks and unit row blocks is assumed to be one line, and the normal and defective states in the crossing area of the unit column and row blocks are taken as a logical sum to obtain the result expressed in one bit, then the matrix is reduced equivalently to a 4-row, 4-column memory bit matrix 72 as shown in FIG. 7b. Assuming that there are two spare row lines and two spare column lines for the new matrix 72, the process similar to the foregoing line process can be applied.

The second embodiment of the present invention will now be described with reference to FIGS. 8 through 14. This embodiment shown in FIG. 8 differs from the previous embodiment shown in FIG. 1 in that a defect information compressor 7 is provided between the defect information analysis memory 6 and the controlling processor 1. The verification of the memory device 10 by the memory tester 2 and the writing of resultant data to the defect information analysis memory 6 are identical to the operations of the first embodiment. The following describes the operations which take place following the device test.

Figure 9A:
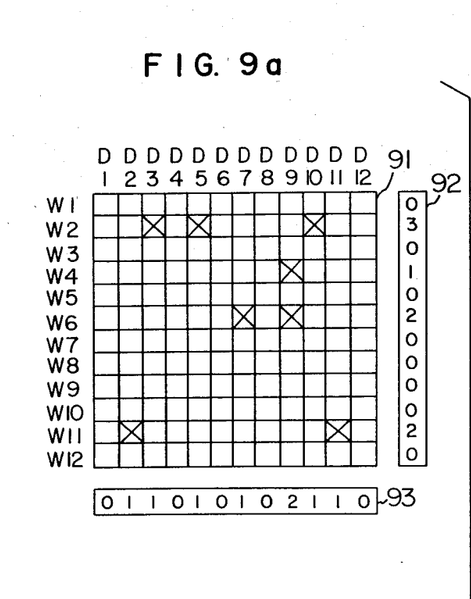
FIG. 9, comprised of FIGS. 9a, 9b and 9c, is a chart showing the procedures of the defect information compressing process.

In response to the end signal from the memory tester 2, the controlling processor 1 issues the start signal to the defect information compressor 7. The process of the defect information compressor 7 initiated by the start signal will be explained using FIG. 9. The memory device 10 under test is assumed to have two spare data lines and two spare word lines for the 12-by-12 memory bit matrix including defective bits registered in the defect information analysis memory 6 as shown by 91 of FIG. 9a.

Figure 9B:
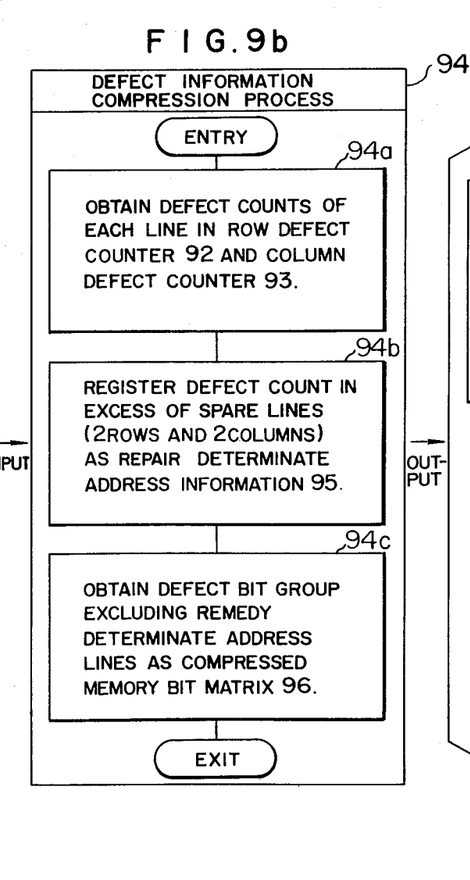
Figure 9C:
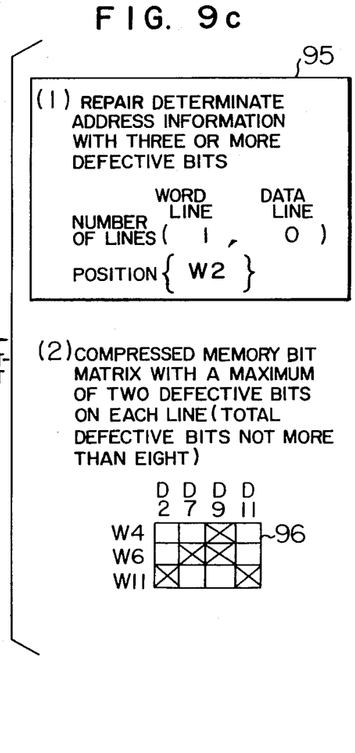

The number of defective bits on each row and column is counted to obtain the row defect count 92 and column defect count 93 (step 94a). Since the arrangement including Rx spare rows and Ry spare columns cannot repair lines with defective bits of Rx+1 or more in the direction of a column and Ry+1 in the direction of a row, use of spare lines to repair such lines is determinate, and for the arrangement of two spare rows and two spare columns, lines with three or more defective bits are given a repair determinate address information 95 (step 94b). Excluding the repair determinate address lines, items of the row counter 92 and column counter 93 having non-zero values are extracted as elements of a matrix to form a compressed memory bit matrix 96 (step 94c).

Figures 11A, 11B, 11C, 14:
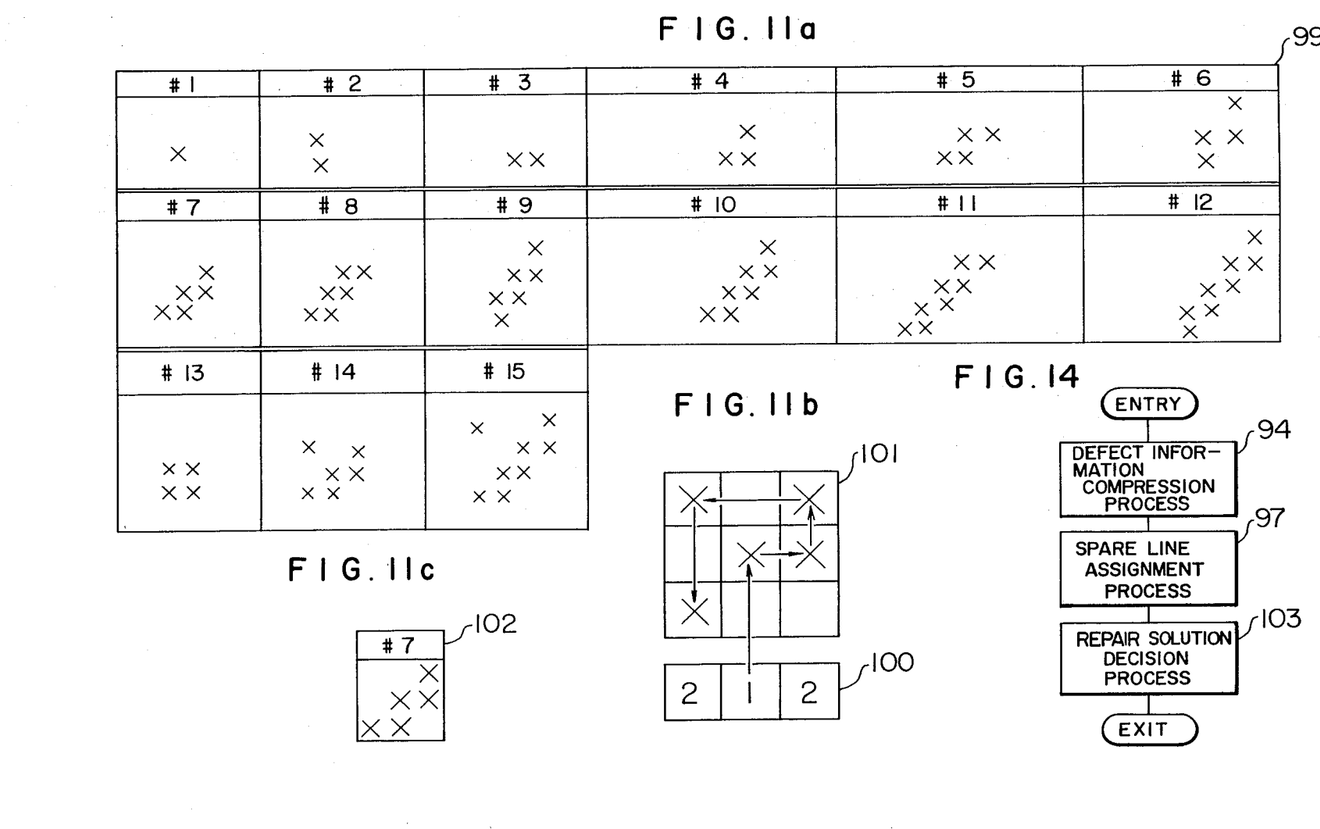
FIGS. 11a through 11c are diagrams used to explain the submatrix analysis table.
FIG. 14 is a chart showing the procedures of the overall process according to the second embodiment of the invention.

Upon completion of this process, the defect information compressor 7 sends the end signal back to the controlling processor 1. In response to the end signal from the defect information compressor 7, the controlling processor 1 receives information including the repair determinate address information 95 and compressed memory bit matrix 96. The upper limit of the total number of defective bits included in the compressed memory bit matrix 96 is set in advance to a certain value (e.g., eight). Then, possible submatrices existing in the compressed matrix having defective bits of two or less on each line and a total number of defective bits of not more than eight are the 15 cases as shown in FIG. 11a. Extraction of these submatrices 99 can readily be realized, as will be described in the following items (1), (2) and (3), no matter what distribution is taken by the submatrices in the compressed memory bit matrix 96. (1) For the cases #1, #3, #4, #5, #7, #8, #10, and #11 of FIG. 11a, the defect count always results in a "1" in the column counter as shown by 100 in FIG. 11b. The search is started from this line, and when a defective bit is detected, the address is recorded and the search course is turned 90 degrees, and these submatrices can be extracted. Namely, for the compressed bit matrix 101, a submatrix #7 referred to by 102 can be obtained in this method. The end condition of this process is that no defective bit is detected. (2) For the cases #2, #6, #9, and #12 of FIG. 11a, these submatrices can be extracted by starting the search from the line of "1" in the row counter. (3) For the cases #13, #14 and #15 of FIG. 11a, these submatrices can be extracted by starting the search from the line of two defective bits following the above processes (1) and (2).

Figures 10A, 10B:
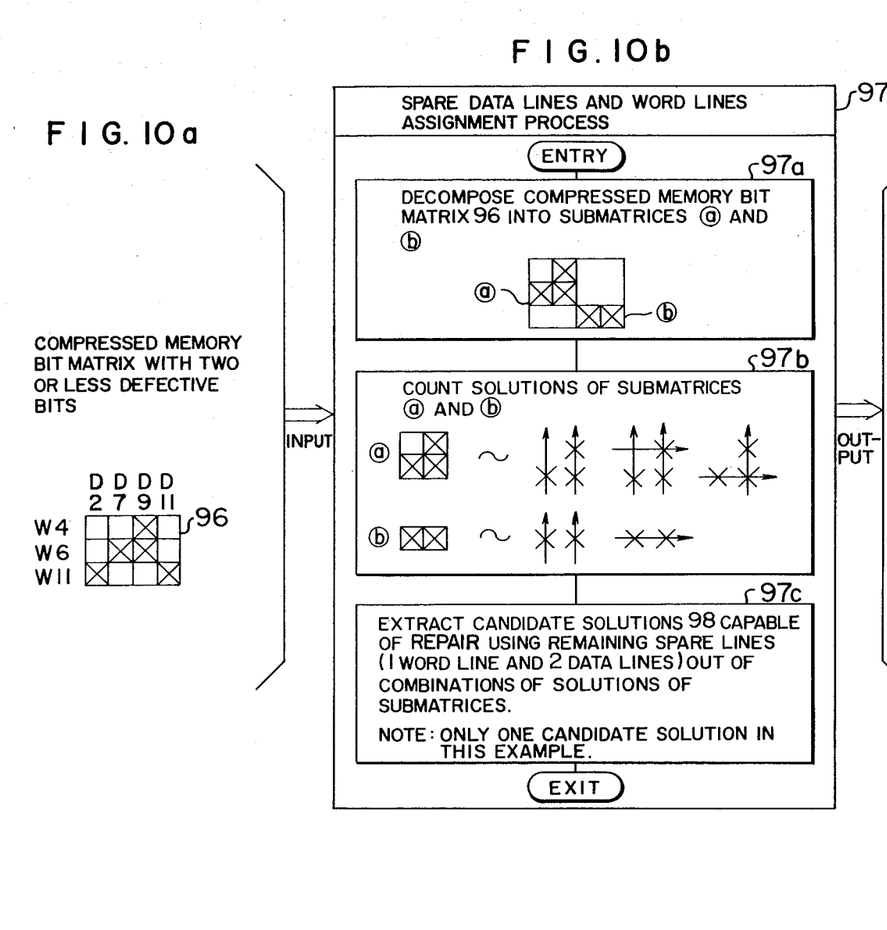
FIG. 10, comprised of FIGS. 10a, 10b and 10c, is a chart showing the procedures of the spare line assigning process.

By this method, a big problem of handling the compressed memory bit matrix as shown in FIG. 10a can be decomposed to small independent problems shown in FIG. 11a, and possible solutions of each case can be counted separately by the count method explained in connection with FIGS. 3 and 4.

One advantage of this method is that in addition to the count of possible solutions if a submatrix of small probability of occurrence exists from the viewpoint of the current status of the process, an alternative process such as inhibition of remedy can be taken, and this allows remedied memory devices to have a constant level of quality.

The table of submatrices shown in FIG. 11a can be enlarged or reduced by varying the total number of defective bits included in the compressed memory bit matrix so as to match the status of the process.

Figure 10C:
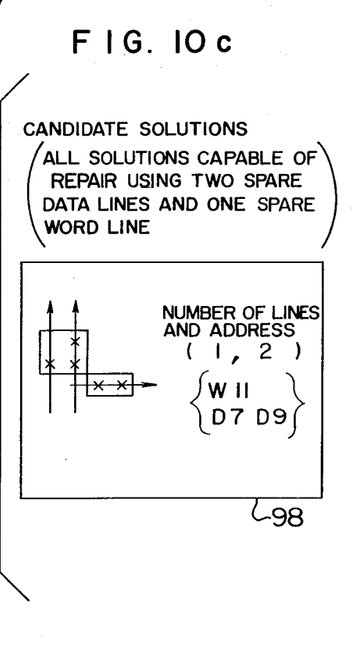

The following describes in detail with reference to FIG. 10 the assignment process 97 for assigning the spare data lines and word lines to the compressed memory bit matrix 96. Using the extraction method explained in connection with FIG. 11b, submatrices ⓐ and ⓑ are obtained in step 97a. Subsequently, in step 97b, the count method explained in connection with FIG. 3 and FIGS. 4a and 4b is used to count possible solutions using remaining one spare word line and two data lines. This process results in three ways of assignment for the submatrix ⓐ and two ways for the submatrix ⓑ. For the overall compressed memory bit matrix 96, candidate solutions 98 requiring two spare data lines and one word line or less are selected out of linear combinations of the submatrices.

Alternatively, instead of decomposing the compressed memory bit matrix into submatrices as described above, it is of course possible to obtain candidate solutions (e.g., 98 for 96) for a resultant compressed memory bit matrix (e.g., 96) using remaining spare lines by the count method explained in FIGS. 3 and 4.

As a still another method of the spare line assignment process 97 of FIG. 10b, it is possible for the submatrix 99 to obtain candidate solutions 98, on condition that spare data lines and word lines within given numbers (e.g., two lines each) are used, from the combination of solutions for the submatrix ⓐ and submatrix ⓑ capable of repair using remaining spare lines (e.g., one word line and two data lines). This method speeds up the process to compensate for the making of the table.

The candidate solutions 98 include all solutions on condition that two spare data lines and one spare word line are left. Line-up of the condidate solutions 98 is followed by the solution decision process.

Figure 12:
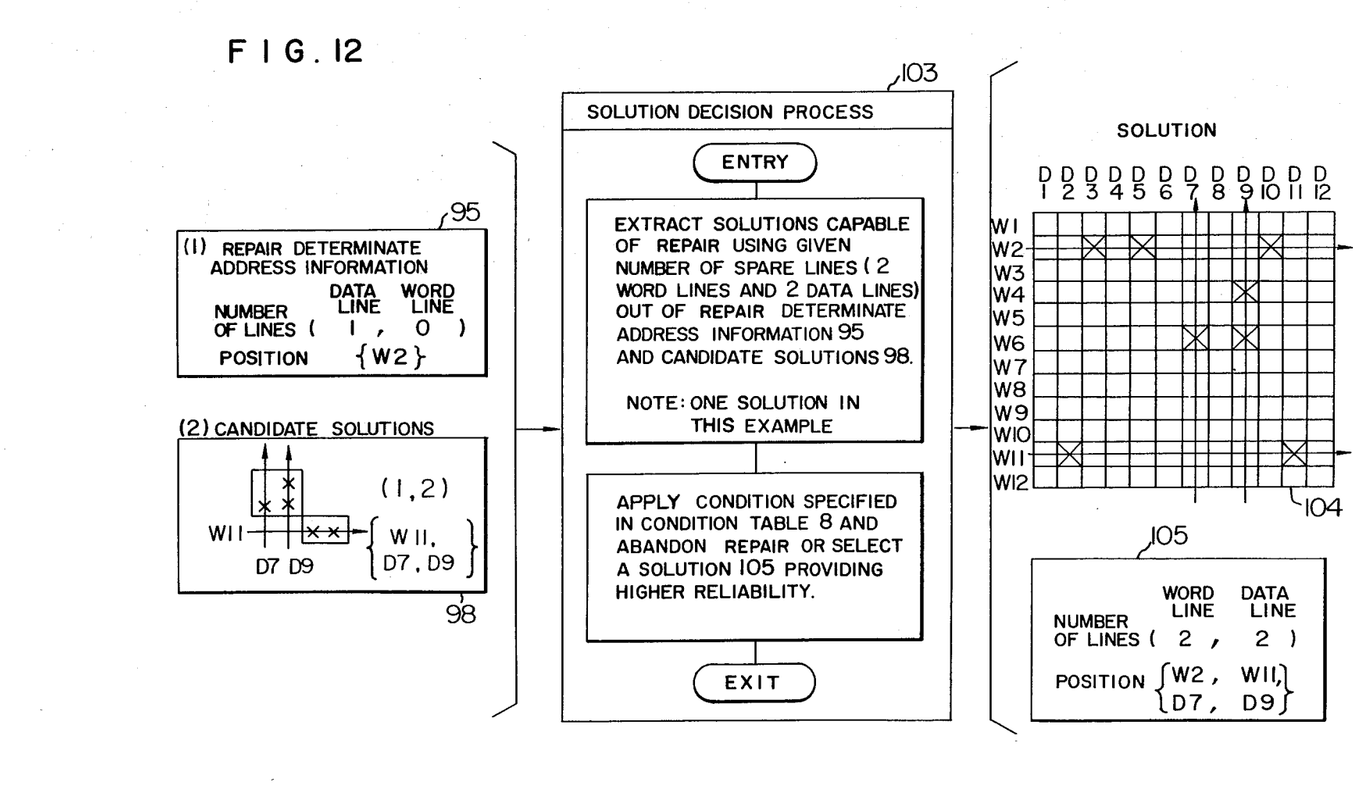
FIG. 12 is a chart showing the procedures of the solution decision process.

The solution decision process will be described with reference to FIG. 12. This process receives the repair determinate address information 95 and candidate solutions 98 obtained in the defect information compression process 94, and outputs a final solution 104. First, among combinations of the repair determinate address information 95 and candidate solutions 98, solutions which suffice the given number of spare lines, i.e., two data lines and two word lines, are selected. Then, the condition of repair is applied to the selected solutions. The condition is stored in the condition table 8 and referred to by the controlling processor 1. The contents of the table can be set arbitrarily.

Figure 13:
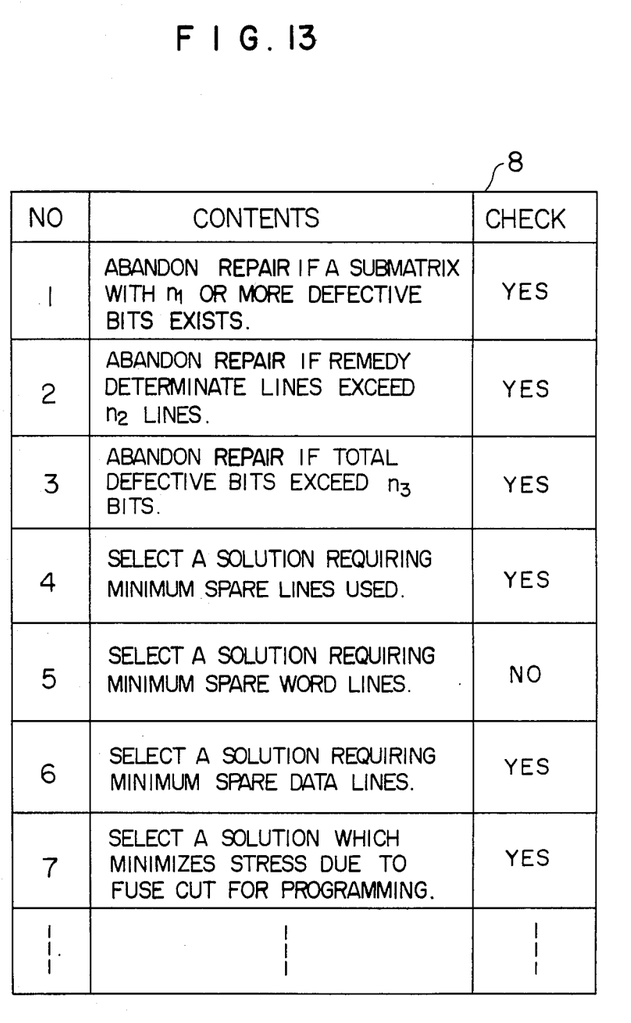
FIG. 13 is a chart used to explain the repair condition table.

FIG. 13 shows the condition table 8. Parameters n1, n2 and n3 in items Nos. 1, 2 and 3 can be set arbitrarily. Each item has the entry for the specification of check so that the condition test is made flexible and another condition can easily be added when the process method described in connection with, for example, FIG. 5b is employed.

FIG. 14 shows the flowchart of the overall process. In the figure, the defect information compression process 94 takes place first. Then, the spare line assignment process 97 follows, and finally the repair solution decision process 103 takes place. The final solution 105 is set as addresses to the defect bit repair processor 9. On receiving the start signal from the controlling processor 1, the defective bit repair processor 9 carries out the repair process such as fuse cut for the memory device 10. After the process has completed, the repair processor 9 sends the end signal to the controlling processor 1. The controlling processor 1 restarts the same procedures for the next memory device 10.

According to the present invention, as described above, defective bits can surely be relieved using less spare lines, whereby the yield of semiconductor memory devices can be improved and the efficiency of production can be enhanced significantly. In particular, screening of all possible solutions under the specified condition yields the best solution, and therefore, the inventive method is effective for maintaining the quality and reliability of seiconductor memory devices.

What is claimed is:

1. A system for repairing a semiconductor memory device wherein a memory device having spare lines arranged in row and column directions of memory array is tested for defective bits and the test result is stored in defect information analysis memory, said system comprising:

controlling processor means for obtaining the best solution for repair based on the test result stored in said defect information analysis memory, including means for executing a first process for repair in which a repairing line is assigned to any row or column that has a number of defective bits larger than a predetermined number of repairing lines, means for forming a compressed matrix of the rows and columns which have defective bits and which remain after execution of said first process without assignment of a repairing line, means for decomposing said compressed matrix into submatrices, means for executing a second process of extracting possible solutions of repair for each of said submatrices, and means for executing a third process of selecting under one or more conditions one of said possible solutions obtained in said second process; and a repair condition table for storing a plurality of conditions used by said controlling processor in executing said third process.

2. A system according to claim 1, wherein said second process extracts said possible solutions through the assignment based on row.

3. A system according to claim 1, wherein said second process extracts said possible solutions through the assignment based on column.

4. A system according to claim 1, wherein said conditions stored in said repair condition table comprises a condition that the number of spare lines on the row and column is minimum.

5. A system according to claim 1, wherein said conditions stored in said repair condition table comprises a condition that use of spare lines of row or column is reluctant.

6. A system according to claim 1, wherein said conditions stored in said repair condition table comprises a condition that the number of fuses to be cut for programming defective lines is minimum.

7. A system according to claim 1, wherein said one or more conditions stored in said repair condition table are selected by said controlling processor.

* * * * *

UNITED STATES PATENT AND TRADEMARK OFFICE
CERTIFICATE OF CORRECTION

PATENT NO.  : 4,627,053
DATED       : December 2, 1986
INVENTOR(S) : YAMAKI, et al It is certified that error appears in the above-identified patent and that said Letters Patent is hereby corrected as shown below:

Title page:

Please correct the second inventors name from

"Shigenori SAKAI" to --Shigenori KASAI--.

Signed and Sealed this

Third Day of October, 1989

Attest:

DONALD J. QUIGG

Attesting Officer

Commissioner of Patents and Trademarks